United States Patent
Li

(10) Patent No.: US 11,715,632 B2
(45) Date of Patent: Aug. 1, 2023

(54) REACTION CHAMBER AND SEMICONDUCTOR PROCESSING APPARATUS

(71) Applicant: BEIJING NAURA MICROELECTRONICS EQUIPMENT CO., LTD, Beijing (CN)

(72) Inventor: Xingcun Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 657 days.

(21) Appl. No.: 16/183,964

(22) Filed: Nov. 8, 2018

(65) Prior Publication Data

US 2019/0074164 A1    Mar. 7, 2019

Related U.S. Application Data

(63) Continuation of application No. PCT/CN2016/099022, filed on Sep. 14, 2016.

(30) Foreign Application Priority Data

May 12, 2016  (CN) .......................... 201610312544.0

(51) Int. Cl.
    *H01L 21/00*    (2006.01)
    *C23C 16/00*    (2006.01)
    (Continued)

(52) U.S. Cl.
    CPC ........ *H01J 37/32568* (2013.01); *C23C 16/50* (2013.01); *C23C 16/509* (2013.01);
    (Continued)

(58) Field of Classification Search
    None
    See application file for complete search history.

(56) References Cited

U.S. PATENT DOCUMENTS 5,567,243 A * 10/1996 Foster ................... C23C 16/452
                                                     118/730
5,865,896 A *  2/1999 Nowak ............... H01J 37/3244
                                                     118/723 I
(Continued)

FOREIGN PATENT DOCUMENTS

CN       1875453 A    12/2006
CN    102586890 A     7/2012
(Continued)

OTHER PUBLICATIONS

The World Intellectual Property Organization (WIPO) International Search Report for PCT/CN2016/099022 dated Dec. 29, 2016 2 Pages.

*Primary Examiner* — Sylvia MacArthur
*Assistant Examiner* — Michelle Crowell
(74) *Attorney, Agent, or Firm* — Anova Law Group, PLLC

(57) ABSTRACT

A reaction chamber includes an upper electrode device and a lower electrode device. The lower electrode device is disposed in the reaction chamber for carrying a workpiece to-be-processed. The upper electrode device includes a dielectric cylinder, a coil, an upper power source, an upper electrode plate, a first switch, and a second switch. The dielectric cylinder has a hollow cylindrical structure and is disposed at an upper portion of a chamber wall of the reaction chamber. The coil is arranged around the dielectric cylinder. The upper electrode plate is located above the lower electrode device. The first switch can selectively electively connect the upper power source to a first terminal of the coil or to the upper electrode plate. The second switch (Continued)

can selectively electrically connect a second terminal of the coil to the ground or to the upper electrode plate.

19 Claims, 8 Drawing Sheets

(51) Int. Cl.
    *H01J 37/32*     (2006.01)
    *C23C 16/509*     (2006.01)
    *C23C 16/50*     (2006.01)

(52) U.S. Cl.
    CPC ......... *H01J 37/321* (2013.01); *H01J 37/3211* (2013.01); *H01J 37/3244* (2013.01); *H01J 37/32091* (2013.01); *H01J 37/32119* (2013.01); *H01J 37/32174* (2013.01); *H01J 2237/3321* (2013.01)

(56) References Cited

U.S. PATENT DOCUMENTS

| | | | | |
|---|---|---|---|---|
| 5,882,424 | A * | 3/1999 | Taylor | H01J 37/32862 134/1.1 |
| 6,054,013 | A * | 4/2000 | Collins | H01J 37/32522 156/345.27 |
| 6,447,636 | B1 * | 9/2002 | Qian | H01J 37/32009 118/723 I |
| 6,716,303 | B1 * | 4/2004 | Ni | C23F 4/00 156/345.48 |
| 9,171,734 | B1 * | 10/2015 | Toyoda | H01J 37/321 |
| 2002/0153349 | A1 * | 10/2002 | Okumura | H01J 37/321 117/108 |
| 2002/0170678 | A1 * | 11/2002 | Hayashi | H01J 37/321 156/345.48 |
| 2003/0042131 | A1 | 3/2003 | Johnson | |
| 2004/0031564 | A1 * | 2/2004 | Gottscho | H01J 37/321 156/345.24 |
| 2011/0133650 | A1 * | 6/2011 | Kim | H01J 37/32577 315/111.21 |
| 2012/0104274 | A1 * | 5/2012 | Hirayanagi | H01J 37/08 250/424 |
| 2012/0186746 | A1 * | 7/2012 | Morikawa | H01J 37/32091 156/345.38 |
| 2018/0061681 | A1 * | 3/2018 | Koshimizu | H01J 37/32027 |
| 2018/0076063 | A1 * | 3/2018 | Nakayama | H01L 21/6719 |
| 2018/0155821 | A1 * | 6/2018 | Nakamura | C23C 14/081 |

FOREIGN PATENT DOCUMENTS

| | | |
|---|---|---|
| CN | 103021912 A | 4/2013 |
| CN | 103367089 A | 10/2013 |
| CN | 105336559 A | 2/2016 |
| JP | 2004214319 A * | 7/2004 |
| JP | 2008243917 A * | 10/2008 |
| JP | 2011198539 A | 10/2011 |

* cited by examiner

REACTION CHAMBER AND SEMICONDUCTOR PROCESSING APPARATUS

CROSS-REFERENCE TO RELATED APPLICATIONS

This application is a continuation application of International Application No. PCT/CN2016/099022, filed on Sep. 14, 2016, which claims priority of Chinese Patent Application No. 201610312544.0, filed on May 12, 2016. The above enumerated patent applications are incorporated herein by reference in their entirety.

TECHNICAL FIELD

The present disclosure generally relates to the field of semiconductor manufacturing and, in particular, to a reaction chamber and a semiconductor processing apparatus.

BACKGROUND

In the field of semiconductors, commonly used plasma sources for dry etching processes and thin film deposition processes include an inductively coupled plasma (ICP) source and a capacitively coupled plasma (CCP) source. Among them, when the ICP source is used, an electromagnetic field generated by a current passing through a coil excites a reaction gas to generate a plasma. Use of ICP source provides a high plasma density and can cause small damage to a workpiece. When the CCP source is used, an electrical voltage applied between electrodes excites a reaction gas to generate a plasma. Use of CCP source provides a large area uniformity and a high ion energy.

However, an existing reaction chamber may only allow individual use of either the ICP source or the CCP source to generate the plasma without any selection flexibility of the plasma sources. The discharge window and use range of the plasma source used in a certain reaction chamber is thus limited.

SUMMARY

One aspect of the present disclosure provides a reaction chamber, which includes an upper electrode device and a lower electrode device. The lower electrode device is disposed in the reaction chamber for carrying a workpiece to-be-processed. The upper electrode device includes a dielectric cylinder, a coil, an upper power source, an upper electrode plate, a first switch, and a second switch. The dielectric cylinder has a hollow cylindrical structure and is disposed at an upper portion of a chamber wall of the reaction chamber. The coil is arranged around the dielectric cylinder. The upper electrode plate is located above the lower electrode device. The first switch can selectively electively connect the upper power source to a first terminal of the coil or to the upper electrode plate. The second switch can selectively electrically connect a second terminal of the coil to the ground or to the upper electrode plate.

Another aspect of the present disclosure provides a semiconductor processing apparatus, which includes a reaction chamber. The reaction chamber includes an upper electrode device and a lower electrode device. The lower electrode device is disposed in the reaction chamber for carrying a workpiece to-be-processed. The upper electrode device includes a dielectric cylinder, a coil, an upper power source, an upper electrode plate, a first switch, and a second switch. The dielectric cylinder has a hollow cylindrical structure and is disposed at an upper portion of a chamber wall of the reaction chamber. The coil is arranged around the dielectric cylinder. The upper electrode plate is located above the lower electrode device. The first switch can selectively electively connect the upper power source to a first terminal of the coil or to the upper electrode plate. The second switch can selectively electrically connect a second terminal of the coil to the ground or to the upper electrode plate.

DETAILED DESCRIPTION

In order to enable those skilled in the art to better understand the technical solutions of the present disclosure, the reaction chamber and the semiconductor processing apparatus provided by the present disclosure are described in detail below with reference to the accompanying drawings.

The present disclosure provides a reaction chamber and a semiconductor processing apparatus. For example, a plasma can be generated as desired by selectively using different plasma sources in the disclosed reaction chamber. The discharge window and use range of the plasma sources can thus be extended.

Figure 1:
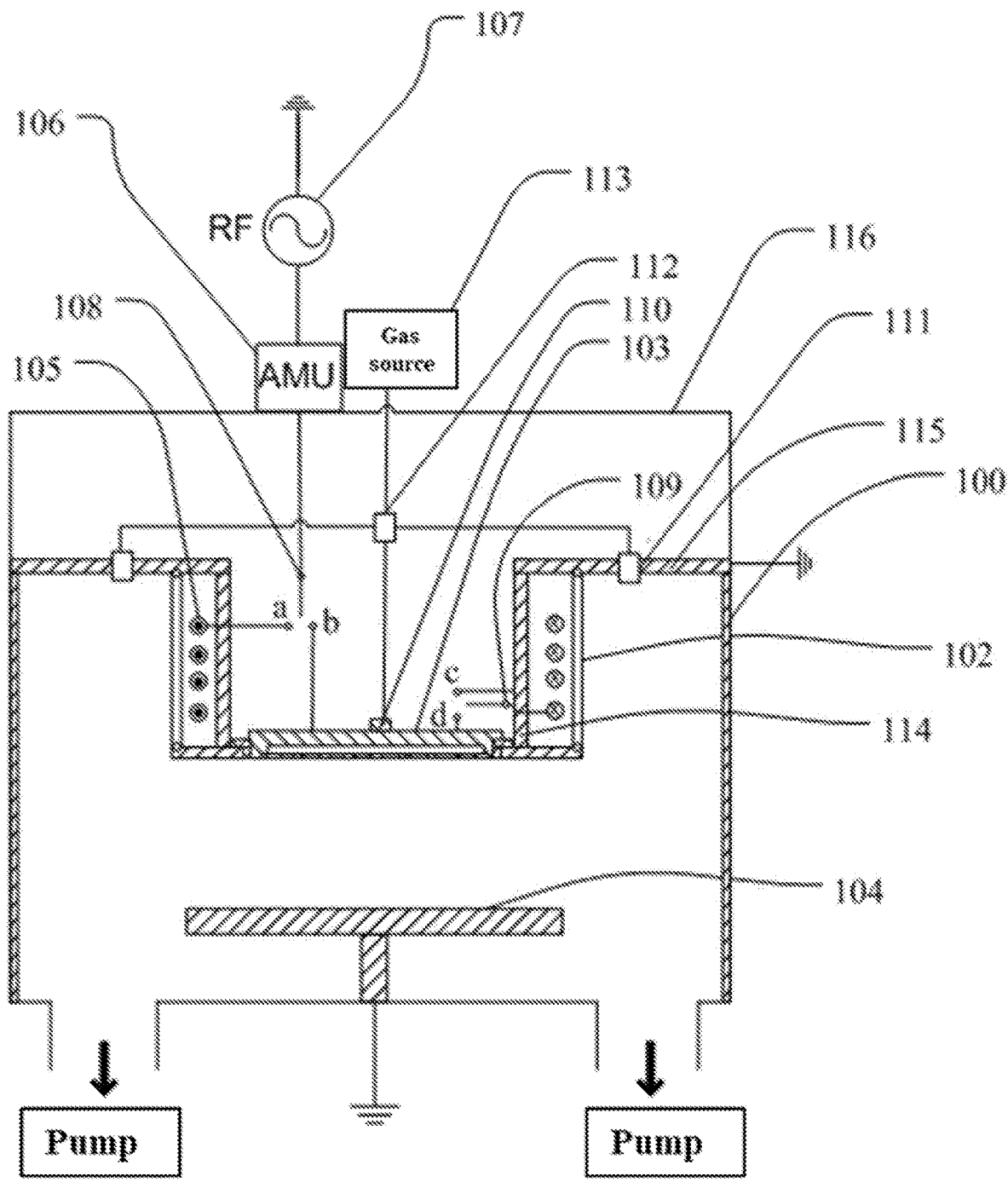
FIG. 1 illustrates a cross-sectional view of an example of a reaction chamber according to some embodiments of the present disclosure.

FIG. 1 illustrates a cross-sectional view of an example of a reaction chamber according to some embodiments of the present disclosure.

Referring to FIG. 1, the reaction chamber 100 includes an upper electrode device and a lower electrode device. The lower electrode device is disposed in the reaction chamber 100 to carry the workpiece to-be-processed. The lower electrode device includes a base 104 and is grounded.

The upper electrode device includes a dielectric cylinder 102, a coil 105, an upper power source 107, an upper electrode plate 103, an electrode support, a first switch 108, and a second switch 109. The electrode support includes a first support member 114 and a second support member 115. The first support member 114 and the second support member 115, together with the upper electrode plate 103 enclose a top opening of the reaction chamber 100. The dielectric cylinder 102 has a hollow cylindrical structure and is disposed at an upper portion of a chamber wall of the reaction chamber 100. The first support member 114 also has a hollow cylindrical structure for fixing the upper electrode board 103. The first support member 114 surrounds an inner side of the dielectric cylinder 102 and is spaced apart from the dielectric cylinder 102 at a certain distance. The coil 105 is disposed around the dielectric cylinder 102 and is located between the dielectric cylinder 102 and the first support member 114. The upper electrode plate 103 is fixed to a bottom of the first support member 114 and is electrically insulated from the first support member 114. A projection of the upper electrode board 103 on a bottom of the reaction chamber 100 can overlap with the projection of the base 104. The second support member 115 is grounded, and has a plate structure and a circular shape. For example, the second support member 115 may have an annular plate structure. An inner edge of the second support member 115 is fixedly connected to an upper portion of the first support member 114. An outer edge of the second support member 115 is fixedly connected to the chamber wall of the reaction chamber 100. The first support member 114 and the second support member 115 can be made of conductive metals, such as aluminum, stainless steel, etc.

Further, the second support member 115 is fixed to the upper portion of the reaction chamber 100. The first support member 114 and the dielectric cylinder 102 are respectively fixed on the second support member 115. In this case, when the coil 105 is discharged, plasma can be mainly generated in a region sandwiched by the chamber wall of the reaction chamber 100 and the dielectric cylinder 102. The projection of the region on the bottom of the reaction chamber 100 is at an edge region of the bottom of the reaction chamber 100 and is annular in shape. When the upper electrode plate 103 is discharged, the plasma can be mainly generated in a region between the upper electrode plate 103 and the base 104, and the projection of this region on the bottom of the reaction chamber 100 is in the central region of the bottom of the reaction chamber 100.

The first switch 108 can be configured to selectively electrically connect the upper power source 107 to one terminal of the coil 105 through the matching unit 106, or to selectively electrically connect the upper power source 107 to the upper electrode plate 103 through the matching unit 106. The second switch 109 can be configured to selectively connect another terminal of the coil 105 to the ground, or to electrically connect the other terminal of the coil 105 to the upper electrode plate 103. In some embodiments, the first switch 108 can be a first transfer switch. The first transfer switch can include, for example, a movable contact and two static contacts. The movable contact of the first transfer switch can be connected to the upper power source 107 through the matching unit 106. One static contact a of the first transfer switch is connected to one terminal of the coil 105, and the other contact b of the first transfer switch is connected to the upper electrode plate 103. Similarly, the second switch 109 can be a second transfer switch. The second transfer switch can include, for example, a movable contact and two static contacts. The movable contact of the second transfer switch is connected to the other terminal of the coil 105. One static contact c of the second transfer switch is connected to the ground through the electrode support, and the other static contact d of the second transfer switch is connected to the upper electrode plate 103.

When the workpiece is processed, the upper power source 107 supplies an excitation power (e.g., a low frequency power or a radio frequency power) through the matching unit 106 to the first switch 108 and the second switch 109, respectively. For example, when the upper power source 107 provides the radio frequency power, the upper power source 107 can be a radio frequency power source.

For example, when the movable contact in the first switch 108 is connected to the static contact b, and the movable contact in the second switch 109 is connected to the static contact c, the upper power source 107 can be electrically connected to the upper electrode plate 103, and the coil 105 can be grounded. In this case, the excitation power can be separately supplied into the upper electrode plate 103, and the reaction gas in the reaction chamber 100 can be excited to form a plasma in a central region between the upper electrode plate 103 and the base 104. That is, the upper electrode plate 103 can be discharged to form the CCP source to generate a plasma.

When the movable contact in the first switch 108 is connected to the static contact a, and the movable contact in the second switch 109 is connected to the static contact c, the upper power source 107 can be electrically connected to one terminal of the coil 105, and the other terminal of the coil 105 is grounded. In this case, the excitation power can be separately supplied to the coil 105, and the reaction gas in the reaction chamber 100 can be excited to form a plasma in the annular edge region between the dielectric cylinder 102 and the chamber wall of the reaction chamber 100. That is, the coil 105 can be discharged to form the ICP source to generate a plasma.

When the movable contact in the first switch 108 is connected to the static contact a, and the movable contact in the second switch 109 is connected to the static contact d, the upper power source 107 can be electrically connected to one terminal of the coil 105, and the other terminal of the coil 105 can be electrically connected to the upper electrode plate 103. In this case, the excitation power can be simultaneously supplied to the coil 105 and the upper electrode plate 103. The plasma can be generated in both of the annular edge region between the dielectric cylinder 102 and the chamber wall of the reaction chamber 100, and the central region between the upper electrode plate 103 and the base 104. That is, both of the coil 105 and the upper electrode plate 103 can be discharged to form the ICP-CCP source to generate a plasma.

Figure 2A:
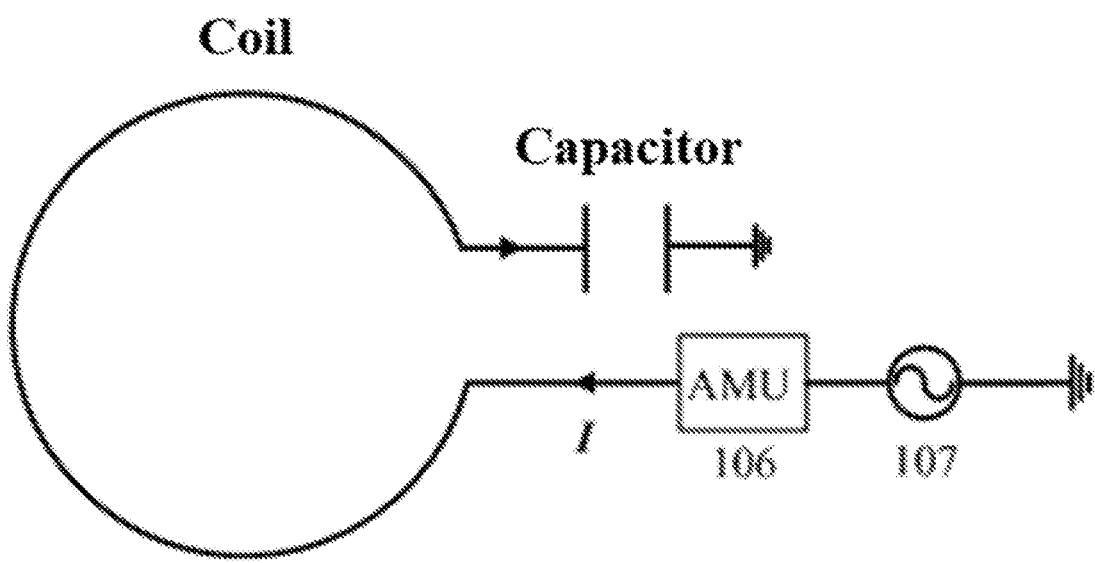
FIG. 2A illustrates an equivalent diagram of the reaction chamber of FIG. 1 when performing a process using an ICP-CCP source.

FIG. 2A illustrates an equivalent diagram of the reaction chamber of FIG. 1 when performing a process using the ICP-CCP source. As shown in FIG. 2A, an alternating current from the upper power source 107 sequentially passes through the coil 105 and the upper electrode plate 103. The upper electrode plate 103 can be equivalently a capacitor connected between the coil 105 and the ground. Thus, the ICP-CCP source formed by the co-discharge of the coil 105 and the upper electrode plate 103 can be compatible with both the electric field uniformity of the CCP source and the high plasma density of the ICP source. In some embodiments, the reaction chamber consistent with the present disclosure can be applied to a plasma-enhanced chemical vapor deposition (PECVD) device. When the PECVD device is used to sequentially perform a cleaning process and a deposition process, the ICP-CCP source can be used to perform the cleaning process. In this way, the speed and uniformity of the cleaning process can be increased, because the ICP-CCP can be compatible with both the electric field uniformity of the CCP source and the high plasma density of the ICP source. In addition, when the deposition process is performed, according to actual conditions, the ICP-CCP source can be switched to the ICP source or the CCP source, to satisfy requirements of the deposition process.

Moreover, the base 104 and the upper electrode plate 103 can generate a planar electric field when a workpiece is processed. An intensity of the electric field generated by the coil 105 may be weakened by the dielectric cylinder 102, and the strength of the planar electric field is much higher than the electrical field generated by the coil 105. Compared to the electrical field generated by coil 105, the planar electric field can play a major role, therefore reducing influence of unevenness of the electrical field of the coil 105. As such, the density distribution of the formed plasma is more uniform.

Figure 2B:
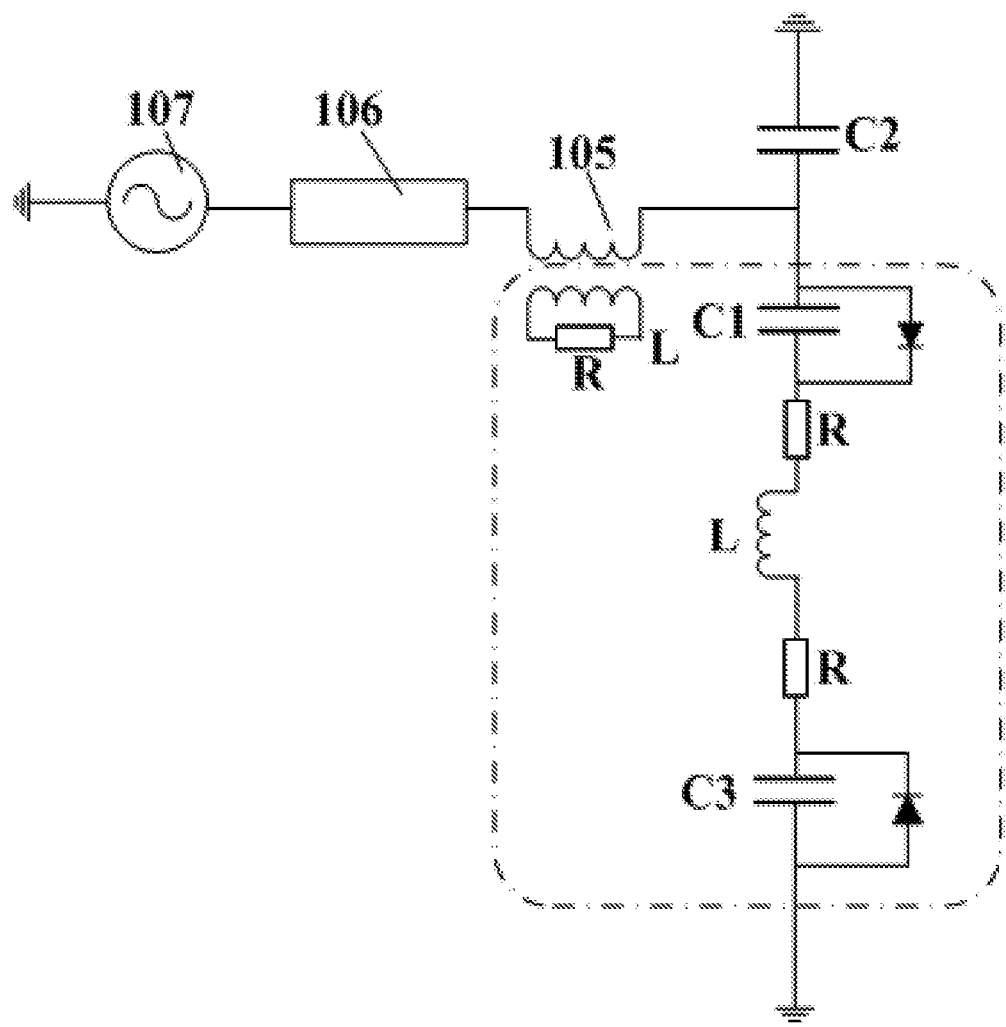
FIG. 2B illustrates an equivalent circuit diagram of the reaction chamber of FIG. 1 when performing a process using an ICP-CCP source.

FIG. 2B illustrates an equivalent circuit diagram of the reaction chamber of FIG. 1 when performing a process using an ICP-CCP source. As shown in FIG. 2B, the dashed box represents the plasma equivalent model. The plasma consists of a plasma sheath and a plasma region. The plasma sheath can be equivalent to a capacitor and a diode structure. The plasma region can be equivalent to a resistor and inductor structure. L is the equivalent inductor formed by the current of the plasma. R is the plasma equivalent resistor. C1 is a first sheath capacitor formed between the upper electrode plate 103 and the plasma sheath. C2 is a collecting capacitor formed between the upper electrode plate 103 and the ground. C3 is the second sheath capacitor formed between the base 104 and the plasma sheath.

As shown in FIG. 2B, when a workpiece is processed, by electrically connecting the coil 105 and the upper electrode plate 103, a parallel capacitor structure can be formed between the upper electrode plate 103 and the ground, and the distributed capacitor C2 and the first sheath capacitor C1 can also be simultaneously formed. The first sheath capacitor C1 can be configured to adjust the phase of the radio frequency current of the coil 105, so that the first sheath capacitor C1 can be adjusted in real time by controlling the process conditions, such as plasma ignition parameters, etc. As such, a phase difference between both terminals of the small coil 105 can be reduced, to further improve the uniformity of the electric field generated by the coil 105, thereby improving the uniformity of density distribution of the plasma.

Thus, the reaction chamber consistent with the present disclosure has the ICP source formed by discharge of the coil 105, the CCP source formed by discharge of the upper electrode plate 103, and the ICP-CCP source formed by the co-discharge of the coil 105 and the upper electrode plate 103. By using the first switch 108 and the second switch 109, switching between three modes of the ICP source, the CCP source and the ICP-CCP source can be achieved. For example, a plasma can be generated as desired by selectively using different plasma sources in the disclosed reaction chamber. The discharge window and use range of the plasma sources can thus be extended.

Figure 3:
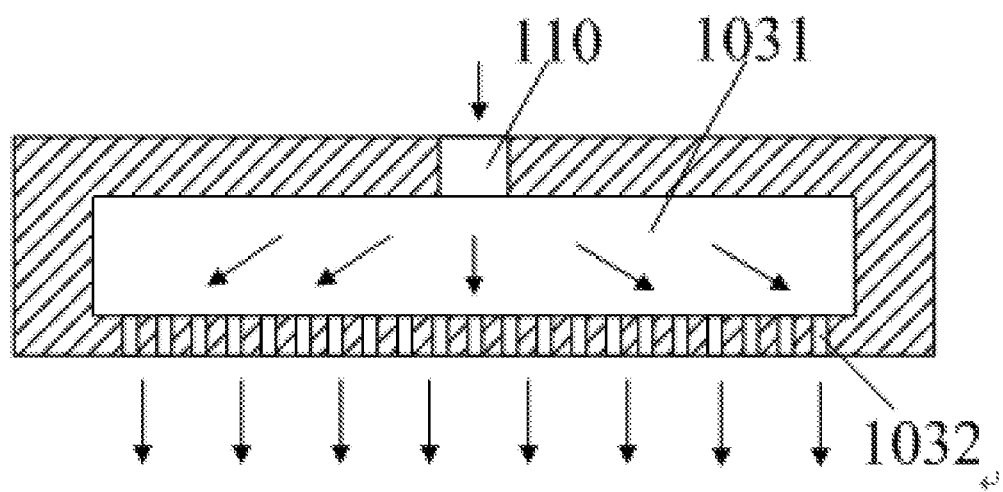
FIG. 3 illustrates a cross-sectional view of an upper electrode plate of FIG. 1 along an axial direction.

In some embodiments, the reaction chamber 100 further includes one or more central gas inlets 110 and a plurality of edge gas inlets 111. FIG. 3 illustrates a cross-sectional view of an upper electrode plate of FIG. 1 along an axial direction. As shown in FIG. 3, the upper electrode plate 103 includes a uniform-flow chamber 1031, which has a hollow structure. The upper chamber wall of the uniform-flow chamber 1031 includes at least one central gas inlet 110 penetrating the upper chamber wall of the uniform-flow chamber 1031 along the axial direction of the uniform-flow chamber 1031. The central gas inlet 110 can convey the reaction gas to the uniform-flow chamber 1031. A bottom chamber wall of the uniform-flow chamber 1031 includes a plurality of gas outlets 1032 extending through the bottom chamber wall of the uniform-flow chamber 1031. The gas outlets 1032 are evenly distributed with respect to the bottom of the uniform-flow chamber 1031, such that, the reaction gas can be uniformly distributed from the uniform-flow chamber 1031 to the central region between the upper electrode plate 103 and the base 104 in the reaction chamber 100. In addition, the plurality of edge gas inlets 111 are disposed on the second support member 115 and arranged along the peripheral direction of the second support member 115. The plurality of edge gas inlets 111 are connected to the interior of the reaction chamber 100. As such, the reaction gas can be uniformly transported to the annular edge region of the reaction chamber 100 between the dielectric cylinder 102 and the chamber wall of the reaction chamber 100.

When a workpiece is processed, the reaction gas enters the uniform-flow chamber 1031 via the above-mentioned central gas inlet 110 and diffuses to the periphery to achieve uniform distribution throughout the uniform-flow chamber 1031. The reaction gas then uniformly flows into the reaction chamber 100 via the plurality of gas outlets 1032. As shown in FIG. 3, the flow of the reaction gas is indicated by an arrow.

In addition, the reaction chamber 100 further includes a gas source 113 and a gas distribution device 112. The gas source 113 can supply the reaction gas. The gas distribution device 112 can distribute the reaction gas from the gas source 113 to the central gas inlet 110, and or the edge gas inlets 111. As such, according to the current plasma source, the reaction gas can be controlled to enter the reaction chamber 100 through the corresponding central gas inlet 110.

In some embodiments, a shield cover 116 is further disposed above the electrode support, and the shield cover 116 is grounded. When a workpiece is processed, the shield cover 116 can shield the electromagnetic field generated by the coil 105 and/or the upper electrode plate 103, thereby avoiding a radio frequency radiation from the radio frequency electrical power.

It should be noted that, although the first switch 108 and the second switch 109 can be transfer switches, any suitable switches can be used and encompassed within the scope of the present disclosure. In exemplary applications, each of the first switch 108 and the second switch 109 can include electronic switches. Each electronic switch may include two independent switches, and a switch controller. The electronic switches can be relays, diodes, or radio frequency switches, etc. For example, in the first switch 108, the two independent switches can be connected to a circuit between the upper power source 107 and a terminal of the coil 105 (e.g., a first terminal of the coil 105), and to a circuit between the upper power source 107 and the electrode plate 103. The switch controller can selectively control on/off of the two independent switches, to achieve the upper power source 107 to electrically connect to the first terminal of the coil 105 or electrically connect to the upper electrode plate 103. Similarly, in the second switch 109, the two independent switches can be connected to a circuit between the other terminal of the coil 105 (e.g., the second terminal of the coil 105) and the ground, and to a circuit between the second terminal of the coil 105 and the upper electrode plate 103. The switch controller can selectively control on/off of the two independent switches, so that the second terminal of the coil 105 can be electrically connected to the ground or the upper electrode plate 103. It should be understood that the designation of the first terminal of the coil 105 and the second terminal of the coil 105 is merely for description purposes, and is not intended to define the input terminal and output terminal of the coil 105.

In some embodiments, the upper electrode plate 103 includes a uniform-flow chamber 1031. Although the uniform-flow chamber 1031 can have a hollow structure, any suitable structure(s) can be used and encompassed within the scope of the present disclosure. In exemplary applications, the upper electrode plate 103 may also be a solid flat plate. In this case, at least one central gas inlet 110 may be disposed on the flat plate and directly communicate to the interior of the reaction chamber 100.

In addition, by grounding the base 104, the bias generated on the surface of the workpiece to-be-processed placed on the base 104 can be reduced. As such, when the CCP source or the ICP-CCP source is used when a workpiece is processed, defects or damages of the film deposited on the surface of the workpiece to-be-processed can be avoided. In exemplary applications, according to actual conditions, the base 104 can be electrically connected to the upper power source 107.

Figure 4A:
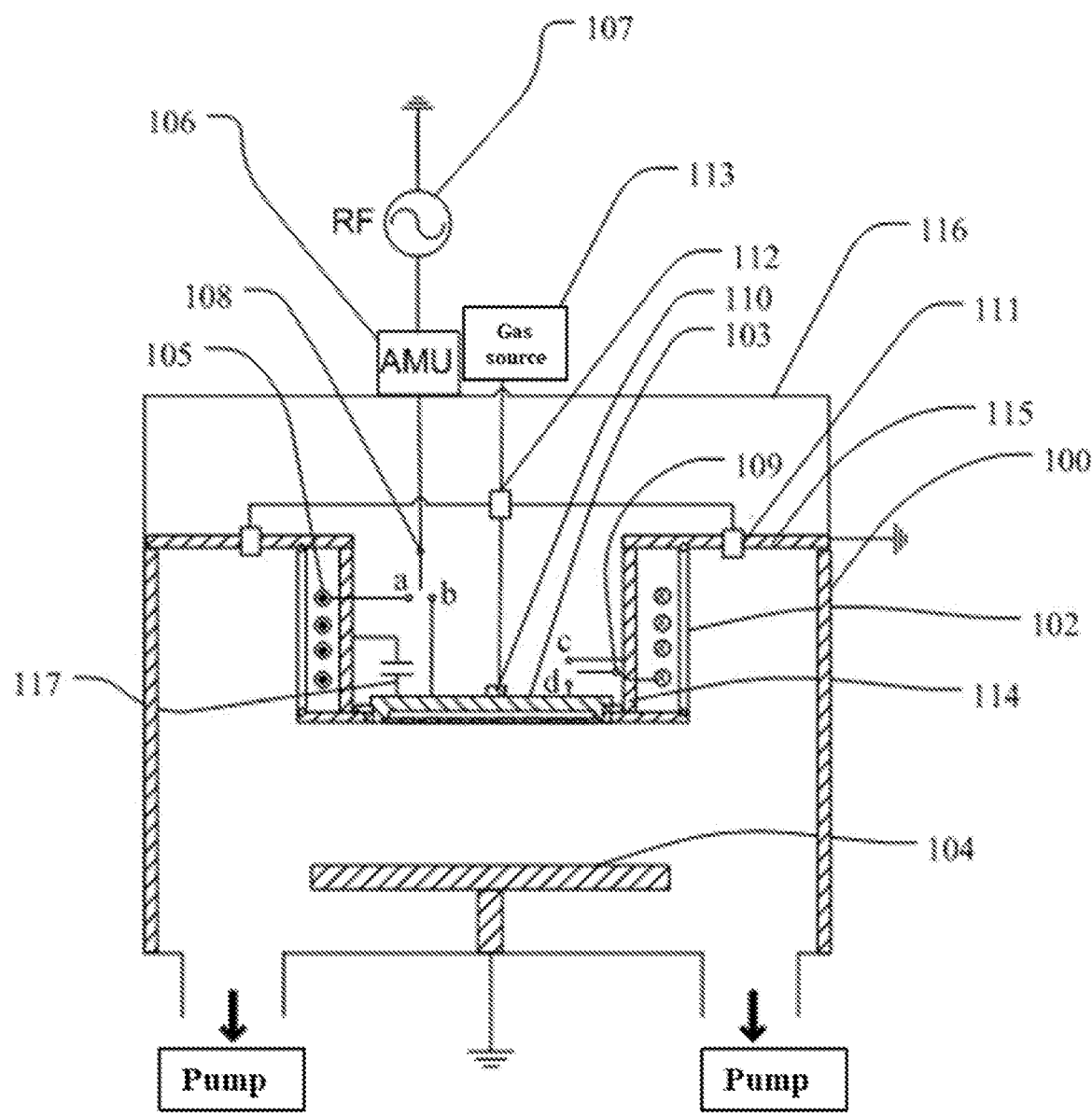
FIG. 4A illustrates a cross-sectional view of another example of a reaction chamber according to some embodiments of the present disclosure.

FIG. 4A illustrates a cross-sectional view of another example of a reaction chamber according to some embodiments of the present disclosure. The reaction chamber 100 shown in FIG. 4A is a variation of the reaction chamber 100 described above in FIG. 1. For example, the reaction chamber 100 in FIG. 4A further includes a fixed capacitor 117. The fixed capacitor 117 is connected in series between the upper electrode plate 103 and the ground. For example, one terminal of the fixed capacitor 117 is connected to the upper electrode plate 103, and the other terminal of the fixed capacitor 117 is grounded through the electrode support.

Figure 4B:
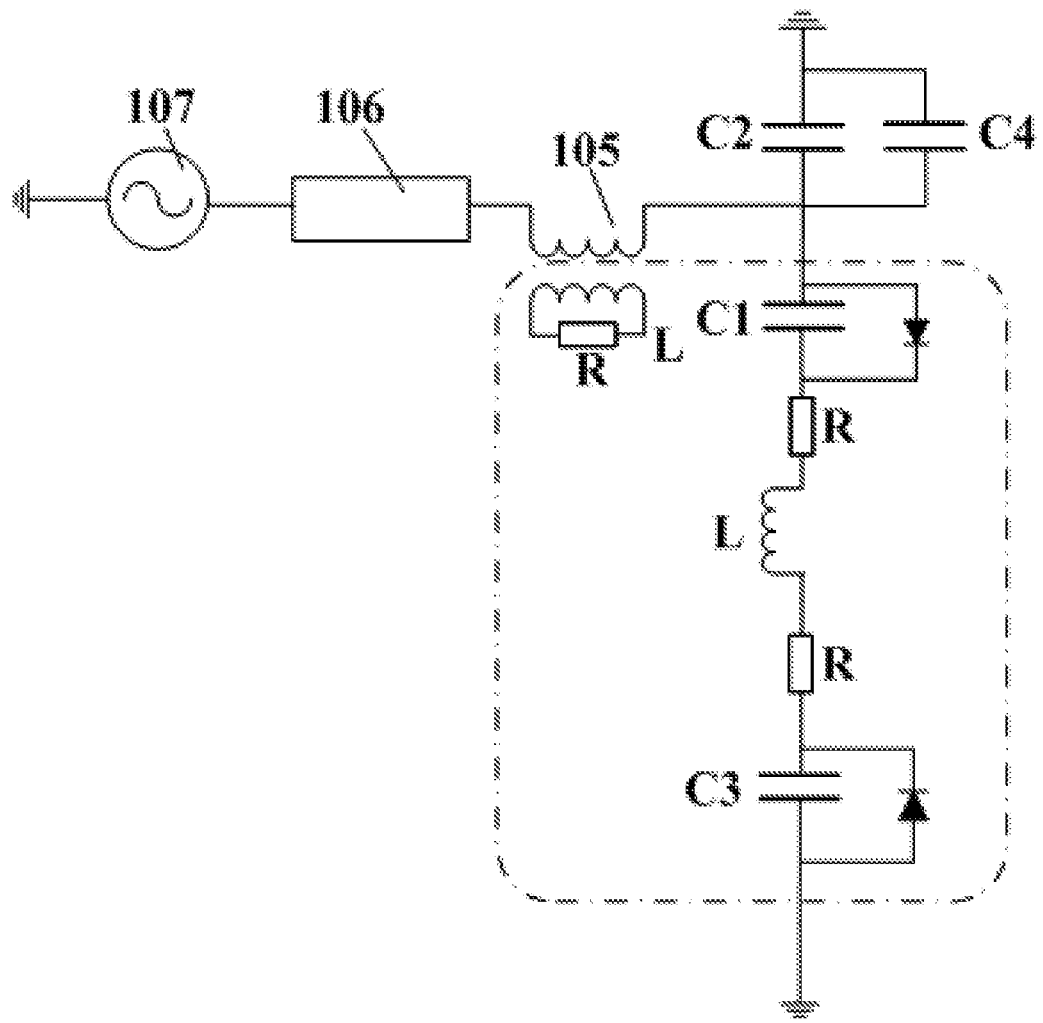
FIG. 4B illustrates an equivalent circuit diagram of the reaction chamber of FIG. 4A when performing a process using an ICP-CCP source.

FIG. 4B illustrates an equivalent circuit diagram of the reaction chamber of FIG. 4A when performing a process using an ICP-CCP source. Referring to FIG. 4B, C4 is a fixed capacitor. The voltage of the coil 105 can be distributed to the first sheath capacitor C1 and the fixed capacitor C4. That is, the fixed capacitor C4 can be configured to divide the voltage applied on the two terminals of the coil 105, to reduce the voltage difference between two terminals of the coil 105. As such, the uniformity of the electric field generated by the coil 105 can be further improved. In addition, through the fixed capacitor C4 dividing the voltage, it is also possible to prevent the upper electrode plate 103 from being ignited due to the excessive voltage at the output terminal of the coil 105.

In exemplary applications, the above fixed capacitor C4 can also be replaced by a tunable capacitor. The capacitance of the tunable capacitor is adjustable, such that the voltage distribution across the coil 105 can be adjusted by adjusting the capacitance of the tunable capacitor to the circuit. As such, the voltage difference between the two terminals of the coil 105 can be reduced. Not only the uniformity of the electric field generated by the coil 105 can be further improved, but also the flexibility of capacitance adjustment can be improved.

Figure 5:
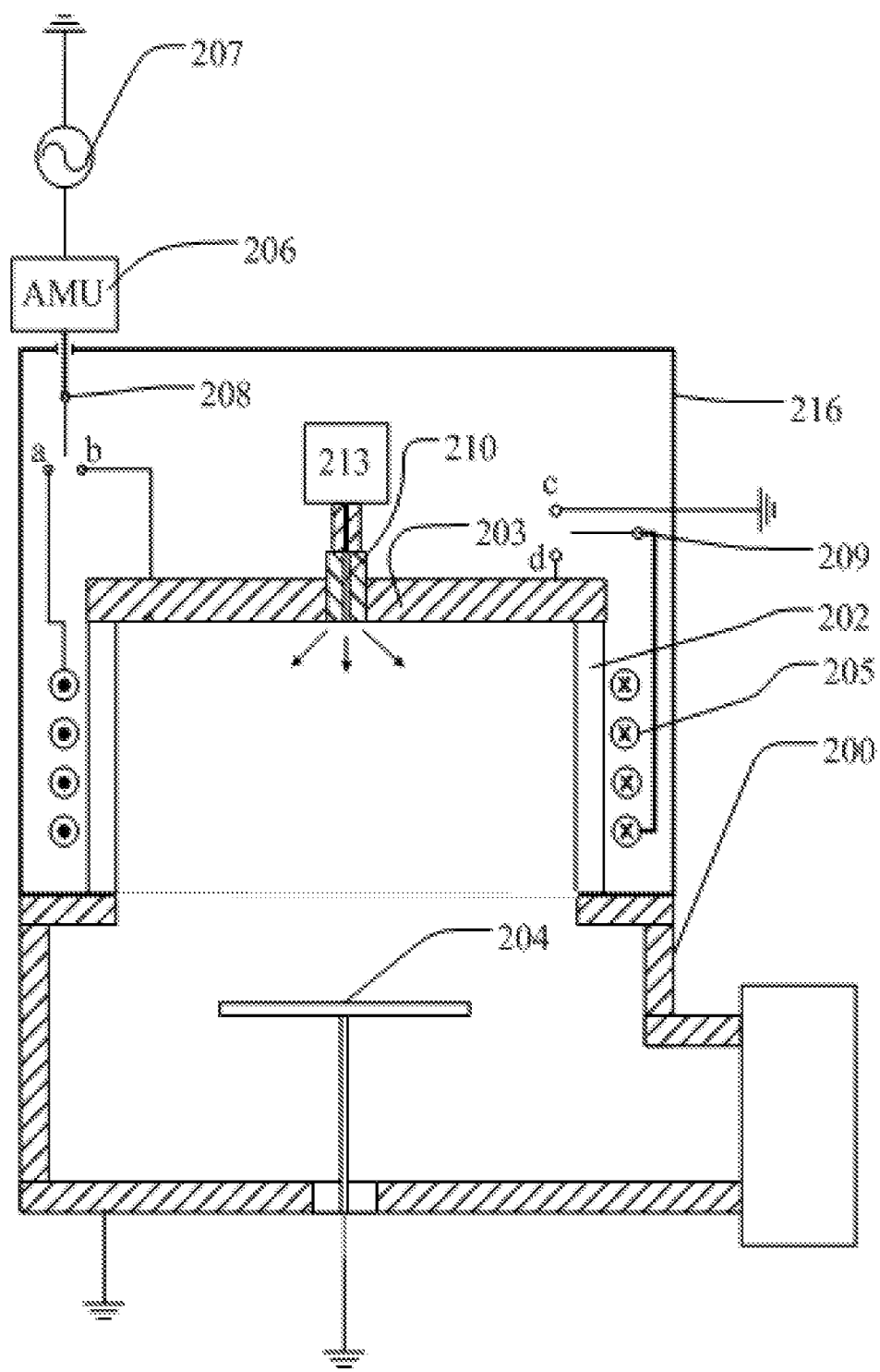
FIG. 5 illustrates a cross-sectional view of another example of a reaction chamber according to some embodiments of the present disclosure.

FIG. 5 illustrates a cross-sectional view of another example of a reaction chamber according to some embodiments of the present disclosure. Referring to FIG. 5, compared to the embodiments described above in FIG. 1, structure of the upper electrode device of the reaction chamber 200 is different.

For example, the reaction chamber 200 includes an upper electrode device and a lower electrode device. The lower electrode device is disposed in the reaction chamber 200 for carrying the workpiece to-be-processed. The lower electrode device includes a base 204 and is grounded.

The upper electrode device includes a dielectric cylinder 202, a coil 205, an upper power source 207, a matching unit 206, an upper electrode plate 203, a shield cover 216, a first switch 208, and a second switch 209. The dielectric cylinder 202 is a hollow cylindrical structure and is disposed at the upper portion of the reaction chamber 200. For example, the dielectric cylinder 202 is disposed outside the reaction chamber 200 and supported by the upper portion of the chamber wall of the reaction chamber 200. A top opening of the chamber wall of the reaction chamber 200 is covered by the inside of the dielectric cylinder 202. Through the top opening of the chamber wall, the inner space of the dielectric cylinder 202 can communicate with a hollow structure of the reaction chamber 200. The upper electrode plate 203 has a plate shape and is disposed at the upper portion of the dielectric cylinder 202 to enclose the top opening of the dielectric cylinder 202. In this way, the dielectric cylinder 202, the upper electrode plate 203, and the top wall of the reaction chamber 200 can enclose the top opening of the reaction chamber 200. The interior of the dielectric cylinder 202 can communicate to the interior of the reaction chamber 200. As such, chamber walls of the upper electrode plate 203, the dielectric cylinder 202, and the reaction chamber 200 can form a closed processing space. The coil 205 is disposed around the outside of the dielectric cylinder 202. Further, structures and functions of other parts in the upper electrode device are similar to those of the corresponding parts of the embodiments described above and are be described herein.

The reaction chamber 200 further includes a central gas inlet 210 and a gas source 213. The central gas inlet 210 is disposed at a central position of the upper electrode plate 203 and communicates with the interior of the reaction chamber 200. When the workpiece is processed, the reaction gas supplied from the gas source 213 enters the interior of the reaction chamber 200 via the central gas inlet 210.

In exemplary applications, the number of the central gas inlets 210 may be two or more, and the central gas inlets 210 are evenly distributed along the plane of the upper electrode plate for uniformly transporting the reaction gas into the reaction chamber 200.

In some embodiments, the upper electrode plate 203 has a plate shape, although any suitable shapes can be used and encompassed within the scope of the present disclosure. In exemplary applications, similar to the above embodiments shown in FIG. 1, the upper electrode plate 203 may include a uniform-flow chamber. Moreover, at least one central gas inlet 210 is disposed at the upper chamber wall of the uniform-flow chamber for transporting the reaction gas into the uniform-flow chamber. Multiple gas outlets are disposed at the bottom of the uniform-flow chamber and are evenly distributed with respect to the bottom of the uniform-flow chamber for uniformly transporting the reaction gas from the uniform-flow chamber into the reaction chamber 200. When the workpiece is processed, the reaction gas first enters the uniform-flow chamber through the at least one central gas inlet 210, and diffuses to the periphery to achieve uniform distribution throughout the uniform-flow chamber, and then uniformly flows into the reaction chamber through the corresponding gas outlet.

Figure 6:
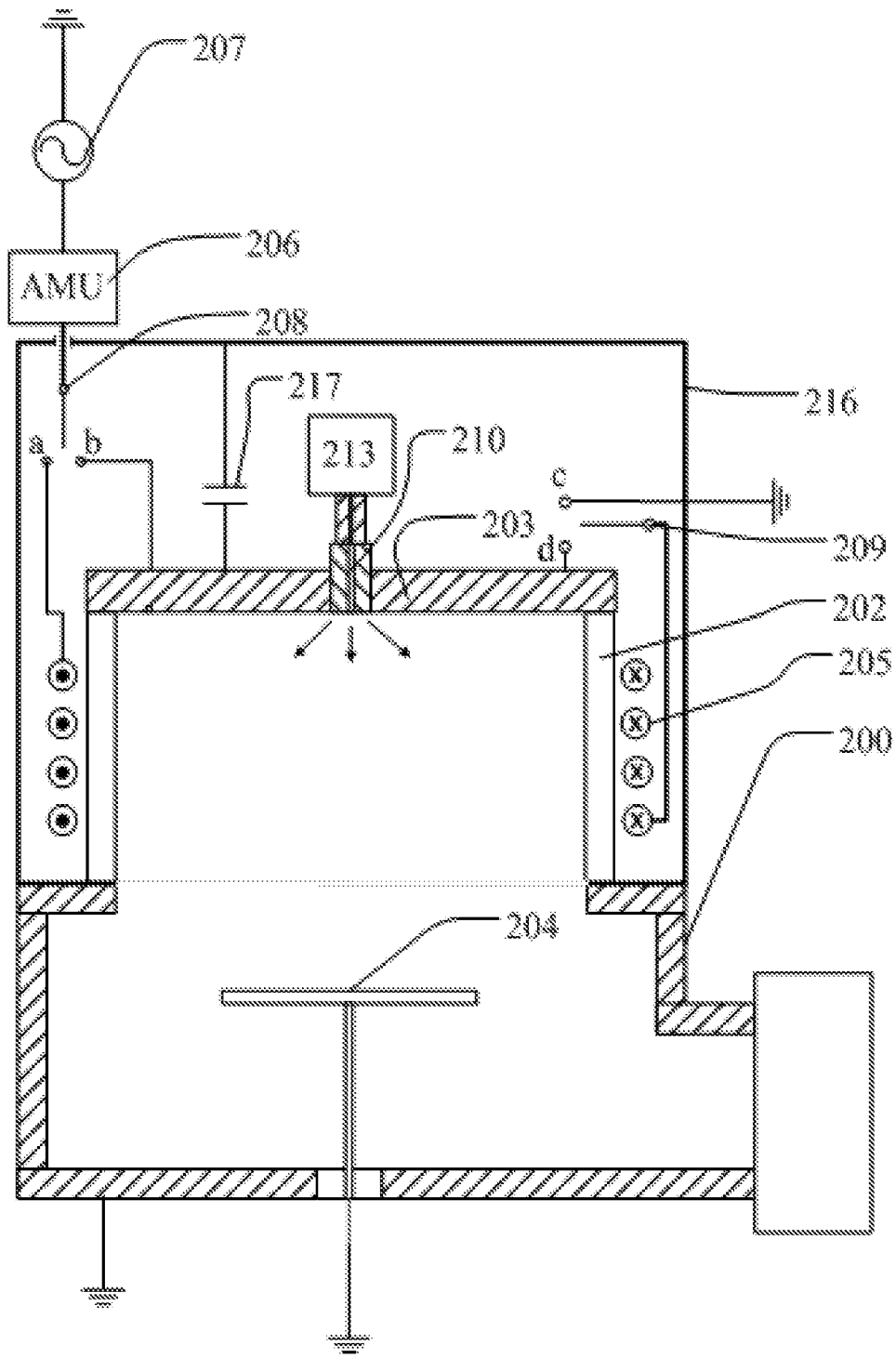
FIG. 6 illustrates a cross-sectional view of another example of a reaction chamber according to some embodiments of the present disclosure.

FIG. 6 illustrates a cross-sectional view of another example of a reaction chamber 200 according to some embodiments of the present disclosure. The reaction chamber 200 shown in FIG. 6 is different from the reaction chamber 200 described above in FIG. 5. For example, referring to FIG. 6, the reaction chamber 200 further includes a fixed capacitor 217. The fixed capacitor 217 is connected to a circuit between the upper electrode plate 203 and the ground. For example, the fixed capacitor 217 is grounded through the shield cover 216.

Similar to embodiments described above, for example, shown in FIG. 4A, the fixed capacitor 217 can be configured to divide the voltage applied to the two terminals of the coil 205 to reduce the voltage difference between the terminals of the coil 205. As such, the uniformity of the electric field generated by the coil 205 can be further improved. In addition, through the fixed capacitor 217 dividing the voltage, it is also possible to prevent the upper electrode plate 203 from being ignited due to the excessive voltage at the output terminal of the coil 205.

In exemplary applications, the above fixed capacitor 217 can also be replaced by a tunable capacitor. The capacitance of the tunable capacitor can be adjusted, thus, the voltage distribution across the coil 205 can be adjusted by adjusting the capacitance of the tunable capacitor to the circuit. As such, the voltage difference between the two terminals of the coil 205 can be reduced. Not only the uniformity of the electric field generated by the coil 205 can be further improved, but also the flexibility of capacitance adjustment can be improved.

Another aspect of the present disclosure further provides a semiconductor processing apparatus including a reaction chamber. The reaction chamber is consistent with the reaction chambers described by the above embodiments of the present disclosure.

As such, the reaction chamber consistent with the present disclosure has the ICP source formed by discharge of the coil, the CCP source formed by discharge of the upper electrode plate, and the ICP-CCP source formed by the co-discharge of the coil and the upper electrode plate. By using the first switch and the second switch, switching between the three modes of the ICP source, the CCP source and the ICP-CCP source can be achieved. For example, a plasma can be generated as desired by selectively using different plasma sources in the disclosed reaction chamber. The discharge window and use range of the plasma sources can thus be extended.

The semiconductor processing apparatus consistent with the present disclosure may include the disclosed reaction chamber according to various embodiments of the present disclosure. The plasma can be generated as desired by selectively using different plasma sources in the disclosed reaction chamber. The discharge window and use range of the plasma sources can thus be extended.

It is to be understood that the above embodiments are merely exemplary embodiments employed to explain the principles of the disclosure, but the disclosure is not limited thereto. Various modifications and improvements can be made by those skilled in the art without departing from the spirit and scope of the disclosure. These modifications and improvements are also considered to be within the scope of the disclosure.

What is claimed is:

1. A reaction chamber, comprising:
an upper electrode device and a lower electrode device, the lower electrode device being disposed in the reaction chamber for carrying a workpiece to-be-processed, and
the upper electrode device comprising:
a dielectric cylinder, having a hollow cylindrical structure and disposed at an upper portion the reaction chamber, the dielectric cylinder being distanced from a peripheral wall of the reaction chamber;
an upper power source;
an electrode support including a first support member and a second support member, the first support member having a hollow cylindrical structure, being arranged around an inner side of the dielectric cylinder, and being distanced from the dielectric cylinder, the second support member having an annular plate structure and being grounded, an inner edge of the second support member being fixedly connected to an upper portion of the first support member, and an outer edge of the second support member being fixedly connected to the peripheral wall of the reaction chamber;
a coil, disposed between the dielectric cylinder and the first support member, and configured to generate plasma in a region sandwiched by the peripheral wall of the reaction chamber and the dielectric cylinder;
an upper electrode plate, located above the lower electrode device and being fixed to a bottom of the first support member, wherein the electrode support, the upper electrode plate, and a top wall of the reaction chamber together enclose a top opening of the reaction chamber, the upper electrode plate is electrically insulated from the first support member, and the first support member is located between the dielectric cylinder and the upper electrode plate;
at least one central gas inlet, disposed at a bottom of the top opening of the reaction chamber on the upper electrode plate to communicate with an interior of the reaction chamber;
a first switch, configured to selectively electrically connect the upper power source to one of a first terminal of the coil and the upper electrode plate; and
a second switch, configured to selectively electrically connect a second terminal of the coil to one of ground and the upper electrode plate, wherein the second switch is configured to turn on/off of an electrical conduction between the second terminal of the coil and the ground or turn on/off of an electrical conduction between the second terminal of the coil and the upper electrode plate.

2. The reaction chamber of claim 1, wherein the first switch comprises a first transfer switch, the first transfer switch comprising:
a movable contact connected to the upper power source; and
two static contacts, one of the two static contacts being connected to the first terminal of the coil, and another one of the two static contacts being connected to the upper electrode plate.

3. The reaction chamber of claim 1, wherein the second switch comprises a second transfer switch, the second transfer switch comprising:
a movable contact connected to the second terminal of the coil; and
two static contacts, one of the two static contacts being grounded, and another one of the two static contacts being connected to the upper electrode plate.

4. The reaction chamber of claim 1, wherein the first switch comprises:
two independent switches, one of the two independent switches being connected to a circuit between the upper power source and the first terminal of the coil, and another one of the two independent switches being connected to a circuit between the upper power source and the upper power plate; and
a switch controller, configured to selectively control on and off of the two independent switches.

5. The reaction chamber of claim 1 wherein the second switch comprises:
two independent switches, one of the two independent switches being connected to a circuit between the second terminal of the coil and the ground, and another one of the two independent switches being connected to a circuit between the second terminal of the coil and the upper electrode plate; and a switch controller, configured to selectively control on and off of the two independent switches.

6. The reaction chamber of claim 4, wherein each of the independent switches comprises a relay, a diode, or a radio frequency switch.

7. The reaction chamber of claim 1, further comprising:
a plurality of edge gas inlets disposed on the second support member along a circumferential direction of the second support member, and communicating with the interior of the reaction chamber.

8. The reaction chamber of claim 7, wherein:
the upper electrode plate includes a uniform-flow chamber with a hollow structure;
the at least one central gas inlet is disposed in an upper chamber wall of the uniform-flow chamber for transporting a reaction gas into the uniform-flow chamber; and
a plurality of gas outlets are disposed in a bottom of a chamber wall of the uniform-flow chamber, and are evenly distributed with respect to a bottom of the uniform-flow chamber for uniformly transporting the reaction gas from the uniform-flow chamber to the reaction chamber.

9. The reaction chamber of claim 7, further comprising:
a gas source, configured to provide a reaction gas, wherein the reaction gas is further distributed to one or more of the at least one central gas inlet and each of the plurality of edge gas inlets.

10. The reaction chamber of claim 1, wherein:
the dielectric cylinder, the upper electrode plate, and a top wall of the reaction chamber together enclose a top opening of the reaction chamber;
the upper electrode plate is disposed at an upper portion of the dielectric cylinder; and
the coil is located outside the dielectric cylinder.

11. The reaction chamber of claim 10, wherein:
the upper electrode plate includes a uniform-flow chamber with a hollow structure;
the at least one central gas inlet is disposed in an upper chamber wall of the uniform-flow chamber for transporting a reaction gas into the uniform-flow chamber; and
a plurality of gas outlets are disposed in the bottom chamber wall of the uniform-flow chamber, and are evenly distributed with respect to a bottom of the uniform-flow chamber for uniformly transporting the reaction gas in the uniform-flow chamber into the reaction chamber.

12. The reaction chamber of claim 1, further comprising a fixed capacitor or a tunable capacitor, wherein the fixed capacitor or the adjustable capacitor is connected to a circuit between the upper electrode plate and the ground.

13. The reaction chamber of claim 1, wherein the lower electrode device comprises a base, the base being disposed in the reaction chamber, grounded, and configured to carry the workpiece to-be-processed.

14. A semiconductor processing apparatus, comprising:
a reaction chamber, comprising:
an upper electrode device and a lower electrode device, the lower electrode device being disposed in the reaction chamber for carrying a workpiece to-be-processed, the upper electrode device comprising:
a dielectric cylinder, having a hollow cylindrical structure and disposed at an upper portion of the reaction chamber, the dielectric cylinder being distanced from a peripheral wall of the reaction chamber;
an upper power source;
an electrode support including a first support member and a second support member, the first support member having a hollow cylindrical structure, being arranged around an inner side of the dielectric cylinder, and being distanced from the dielectric cylinder, the second support member having an annular plate structure and being grounded, an inner edge of the second support member being fixedly connected to an upper portion of the first support member, and an outer edge of the second support member being fixedly connected to the peripheral wall of the reaction chamber;
a coil, disposed between the dielectric cylinder and the first support member, and configured to generate plasma in a region sandwiched by the peripheral wall of the reaction chamber and the dielectric cylinder;
an upper electrode plate, located above the lower electrode device and being fixed to a bottom of the first support member, wherein the electrode support, the upper electrode plate, and a top wall of the reaction chamber together enclose a top opening of the reaction chamber, the upper electrode plate is electrically insulated from the first support member, and the first support member is located between the dielectric cylinder and the upper electrode plate;
at least one central gas inlet, disposed at a bottom of the top opening of the reaction chamber on the upper electrode plate to communicate with an interior of the reaction chamber;
a first switch, configured to selectively electrically connect the upper power source to one of a first terminal of the coil and the upper electrode plate; and
a second switch, configured to selectively electrically connect a second terminal of the coil to one of ground and the upper electrode plate, wherein the second switch is configured to turn on/off of an electrical conduction between the second terminal of the coil and the ground or turn on/off of an electrical conduction between the second terminal of the coil and the upper electrode plate.

15. The semiconductor processing apparatus of claim 14, wherein the first switch includes a first transfer switch, the first switch comprising:
a movable contact connected to the upper power source; and
two static contacts, one of the two static contacts being connected to the first terminal of the coil, and another one of the two static contacts being connected to the upper electrode plate.

16. The semiconductor processing apparatus of claim 14, wherein the second switch comprises a second transfer switch, the second transfer switch comprising:
a movable contact connected to the second terminal of the coil; and
two static contacts, one of the two static contacts being grounded, and another one of the two static contacts being connected to the upper electrode plate.

17. The semiconductor processing apparatus of claim 14, wherein the first switch comprises:
two independent switches, one of the two independent switches being connected to a circuit between the upper power source and the first terminal of the coil, and another one of the two independent switches being connected to a circuit between the upper power source and the upper power plate; and a switch controller, configured to selectively control on and off of the two independent switches.

18. The semiconductor processing apparatus of claim 14, wherein the second switch comprises:

two independent switches, one of the two independent switches being connected to a circuit between the second terminal of the coil and the ground, and another one of the two independent switches being connected to a circuit between the second terminal of the coil and the upper electrode plate; and a switch controller, configured to selectively control on and off of the two independent switches.

19. The semiconductor processing apparatus of claim 14, wherein:

the dielectric cylinder, the upper electrode plate, and a top wall of the reaction chamber together enclose a top opening of the reaction chamber;

the upper electrode plate is disposed at an upper portion of the dielectric cylinder; and the coil is located outside the dielectric cylinder.

\* \* \* \* \*